United States Patent [19]

Takeuchi et al.

[11] Patent Number: 4,479,435
[45] Date of Patent: Oct. 30, 1984

[54] DEVICE FOR FIXING BY SUCTION AN OFFSET PRINTING PLATE OR LIKE PLATE IN PLANAR STATE

[75] Inventors: Hideo Takeuchi, Shiroi; Satoru Horiguchi, Tsurugashima; Kenichi Mizuno, Tokyo, all of Japan

[73] Assignee: Dai Nippon Insatsu Kabushiki Kaisha, Japan

[21] Appl. No.: 515,885

[22] Filed: Jul. 21, 1983

Related U.S. Application Data

[63] Continuation of Ser. No. 310,774, Oct. 13, 1981, abandoned.

[30] Foreign Application Priority Data

Oct. 17, 1980 [JP] Japan .............................. 55-145398
Oct. 17, 1980 [JP] Japan .............................. 55-145399
Oct. 18, 1980 [JP] Japan .............................. 55-145920
Oct. 28, 1980 [JP] Japan .............................. 55-151022

[51] Int. Cl.$^3$ .......................................... B41F 27/00
[52] U.S. Cl. .................... 101/382 MV; 101/DIG. 24
[58] Field of Search ................. 101/382 MV, 407 BP; 40/10 R, 124; 33/184.5; 269/21; 248/473, 363; 137/517

[56] References Cited

U.S. PATENT DOCUMENTS

| | | | |
|---|---|---|---|
| 724,116 | 3/1903 | Maley | 33/184.5 |
| 2,198,765 | 4/1940 | Featherstone et al. | 269/21 X |
| 2,236,197 | 3/1941 | Moore | 33/184.5 X |
| 2,676,573 | 4/1954 | Abbe | 137/517 X |
| 2,680,994 | 6/1954 | Wood | 269/21 |
| 2,694,337 | 11/1954 | Anander | 269/21 X |
| 2,772,485 | 12/1956 | Gelb | 33/184.5 |
| 2,923,235 | 2/1960 | Voegelin | 101/382 MV |
| 2,939,660 | 6/1960 | Aitkens | 248/473 |
| 3,331,389 | 7/1967 | Kirk | 137/517 X |
| 3,420,171 | 1/1969 | Maul et al. | 101/269 |
| 3,437,065 | 4/1969 | Robbins | 137/517 |
| 3,527,166 | 9/1970 | Jaffa | 101/407 BP |
| 3,577,856 | 5/1971 | Updegraff | 33/430 X |
| 4,262,594 | 4/1981 | Landsman | 101/382 MV |
| 4,373,440 | 2/1983 | Jezbera | 101/93.34 |

FOREIGN PATENT DOCUMENTS

| | | | |
|---|---|---|---|
| 2500198 | 3/1976 | Fed. Rep. of Germany | 101/407 BP |
| 2012213 | 7/1979 | United Kingdom | 101/DIG. 24 |
| 2022514 | 12/1979 | United Kingdom | 101/DIG. 24 |

*Primary Examiner*—Edgar S. Burr
*Assistant Examiner*—John A. Weresh
*Attorney, Agent, or Firm*—Parkhurst & Oliff

[57] ABSTRACT

A device for fixing by suction a printing plate comprises: a casing whose interior is partitioned into a large number of compartments having open front faces; a perforated punching plate fixed to the casing to cover the open front faces of all compartments; a valve device mounted on a valve port formed on the rear side of each compartment; and a negative pressure source connected by way of the valve ports to respective compartments and applying suction to all valve devices, whereby the printing plate placed on the punching plate is fixed by suction tightly thereagainst.

5 Claims, 23 Drawing Figures

DEVICE FOR FIXING BY SUCTION AN OFFSET PRINTING PLATE OR LIKE PLATE IN PLANAR STATE

This is a continuation of application Ser. No. 310,774 filed Oct. 13, 1981 now abandoned.

BACKGROUND OF THE INVENTION

This invention relates to a device for fixing by suction a flexible resin sheet, a metal plate, or like plate-form article (hereinafter referred to collectively as "plate") in a planar state on a table. More particularly, the invention relates to a plate suction fixing device used for fixing by suction a plate, such as a printing plate for offset printing, in a planar state on a table of an apparatus for measuring such characteristics as the proportion of the area of a pattern or design on the plate.

Heretofore, for measuring the area of a printing image, or a pattern, from a printing plate for an offset printing press, a device which detects the quantity of light reflected from the printing plate and, from variations thereof, measures the area (proportion of area) of the printing image has been generally known.

In the treatment processes of a printing plate, it is necessary to carry out a burning treatment in which the plate is heated to 250° and 300° C. in order to improve its printing durability. However, an ordinary printing plate having a hard aluminum plate as a base material undergoes thermal deformation due to heating and even after cooling retains this as a permanent strain, which inevitably impairs the planarity of the printing surface of the printing plate.

In a known apparatus for measuring pattern areas, there is no means for correcting thermal deformations of printing plates. For this reason, it has not been possible to obtain accurate detection precision, and, at the time of offset printing, setting of the rate of ink supply of the offset printing press could not be correctly carried out.

Accordingly, there has previously been proposed a device comprising a negative pressure suction mechanism in a stage or table on which a printing plate is to be fixed, and the printing plate is caused to adhere intimately against the table by the suction of this suction mechanism, whereby the area of the image portion of the printing face can be measured with the printing plate in a planar state wherein its thermal deformation is corrected.

By a device of this character, however, although the deformation at the central part of the printing plate can be sufficiently corrected, its edge portions cannot be satisfactorily caused to adhere intimately against the table surface. Particularly, in the imageless part (A1 grain part) at the lower part of the printing plate, calibration marks to serve as standard references at the time of measurement of the darkness/lightness of the image area (pattern part) are inscribed. For this reason it is necessary to cause amply intimate adherence of the plate against the table surface.

Another difficulty arises from the great variety of sizes and shapes of printing plates to be fixed by suction, which are not uniform, there being some which cover the entire surface of a punching plate of the table and others which cover only a portion of the punching plate.

Therefore, the design of a plate suction fixing device capable of accurately and positively positioning each of nonuniform plates of various sizes and shapes of the punching plate of the table and capable of promptly causing each plate to adhere to the punching plate has been a problem.

SUMMARY OF THE INVENTION

It is a general object of this invention to provide a plate suction fixing device by which the above stated problem can be solved.

According to this invention, briefly summarized, there is provided a device for fixing in planar state by suction an offset printing plate or like plate, this device having front and rear sides and being characterized by: a casing whose interior is partitioned and formed into a plurality of compartments having open front faces lying in a single plane; a punching plate having a great number of punching holes and fixed to the casing so as to cover the open front faces of the compartments; a valve device mounted on a valve port formed in the rear wall of each of the compartments, and a negative pressure source connected by way of the valve ports to the respective compartments and operating to apply suction to all valve devices, whereby the plate placed on the front side of the punching plate is fixed by suction intimately against the punching plate, the valve devices of the compartments covered by the plate being held in opened state, the valve devices of the compartments not thus covered being automatically closed by the suction.

A feature of the plate suction fixing device of this invention is that each valve device has a valve operating automatically to open or close the respective valve port depending on the presence or absence of a part of the plate placed on the punching plate above the respective compartment.

Another feature of the device of this invention is the provision of a bottom positioning device and a side positioning device by which accurate, positive, and rapid positioning of a plate placed on the front surface of the punching plate in two orthogonal directions in the plane of that surface is facilitated.

The nature, utility, and further features of this invention will be more clearly apparent from the following detailed description with respect to a preferred embodiment of the invention and modifications thereof when read in conjunction with the accompanying drawings, briefly described below.

DETAILED DESCRIPTION OF THE INVENTION

Figure 1:
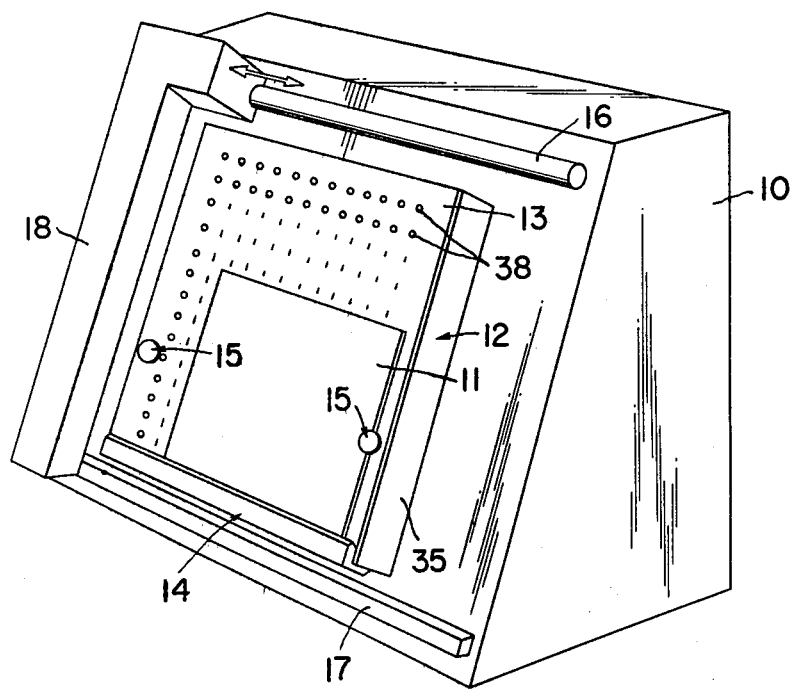
FIG. 1 is a perspective view of an apparatus for measuring pattern area in which is provided a device according to this invention for fixing by suction a plate such as an offset printing plate, as viewed from a point in front of, to the right of, and slightly above the apparatus.
Figure 2:
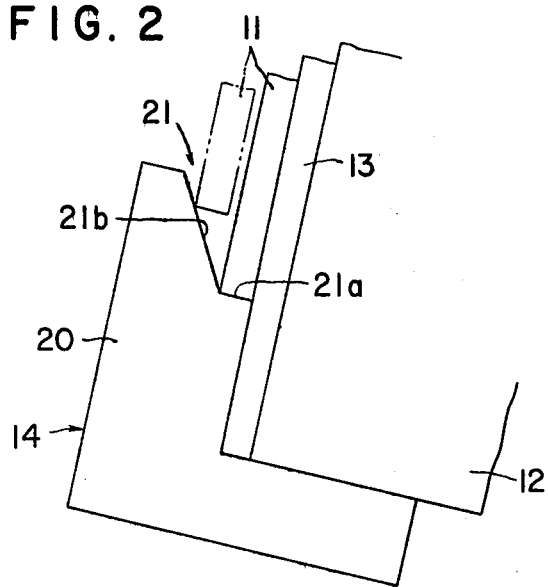
FIG. 2 is a partial right side elevation showing a bottom positioning device used in conjunction with the plate suction fixing device of the invention.

Referring first to FIGS. 1 and 2 showing an example of application of the plate suction fixing device of this invention to a pattern area (proportion) measuring apparatus, the apparatus has a cabinet housing 10. Within this housing 10 is accommodated a negative pressure source (not shown) such as a vacuum pump or a blower, and on the front face of the housing 10 is formed integrally therewith a table 12 for adherence thereto by suction a plate 11 such as a printing plate of offset printing or a flexible sheet. A planar punching plate 13 constitutes the front face of the table 12 and forms a mounting surface for the plate 11.

The plate mounting surface is inclined rearward, sloping upward and toward the rear of the housing 10 thereby to facilitate mounting of a plate 11 on the punching plate 13 of the table 12. The mounted plate 11 is positioned by a bottom positioning device 14 and side positioning device 15, 15 and is fixed in intimate contact with the punching plate 13 by suction action described hereinafter.

The cabinet housing 10 is further provided, at the upper and lower parts of its front face with horizontal guide bars or rails 16 and 17 both extending between the left and right sides of the front face. These guide bars 16 and 17 serve to guide an inspection head 18 in horizontal travel. The inspection head 18 is so adapted and supported as to straddle or span over the table 12 and accommodates therewithin an optical measuring instrument such as a sensor for detecting the darkness/ lightness of a pattern. This measuring instrument comprises an illumination optical system and a detection optical system, by which, at the time of traversing and scanning of the inspection head 18, light projected from the illumination optical system onto the outer surface of the plate 11 is reflected by the plate surface and detected by the detection optical system. Thus, the magnitude of the pattern area of the surface of the plate and the darkness/lightness of the pattern are measured.

The above mentioned bottom positioning device 14 has a bottom positioning member 20 extending across and along the lower part of the punching plate 13. As shown in FIG. 2, this bottom positioning member 20 has at its upper part a cut out supporting part 21 comprising a bottom part 21a which is adjacent at its rear edge and perpendicular to the front surface of the punching plate 13 and a rearwardly declined surface 21b which is contiguous at its lower edge to the forward edge of the bottom part 21a and is sloped downward and rearward or toward the punching plate 13.

A plate 11 such as a printing plate is lowered as indicated by two-dot chain line in FIG. 2 into the supporting part 21, whereupon its lower end is guided toward the punching plate 13 by the declined surface 21b, until the plate 11 is finally in intimate contact with the punching plate 13, and, at the same time, the lower edge surface of the plate 11 is in abutting contact with the bottom part 21a of the supporting part 21. Thus, the bottom positioning of the plate 11 is accomplished.

At the same time that the lower part of the plate 11 is thus positioned by the bottom positioning member 20, side positioning of the plate 11 is carried out by one of the side positioning devices 15, 15. The side positioning devices 15, 15 have side positioning pins 23, 23 respectively on opposite side edge parts of the punching plate 13.

Figure 3:
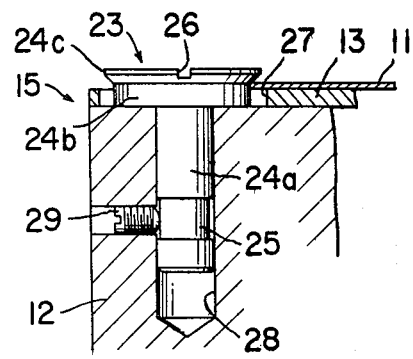
FIGS. 3 and 4 are views, partly in section, respectively taken in planes orthogonal to each other and perpendicular to the plane of the plate to be fixed and showing a plate side positioning device.
Figure 4:
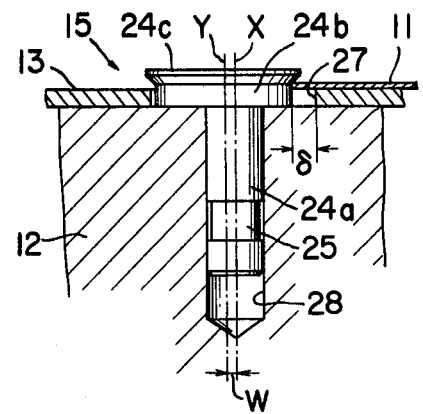
Figure 5:
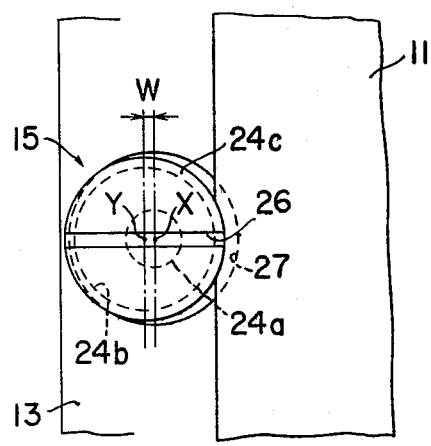
FIG. 5 is a view of the device shown in FIG. 4 as viewed therein from above.

As shown best in FIGS. 3 and 4, each side positioning pin 23 comprises a stem part 24a constituting a support part, a cylindrical part 24b of relatively large diameter contiguously and integrally formed on the outer or front end of the stem 24a, and a circular tapered flange 24c contiguously and integrally formed on the outer or front end of the cylindrical part 24b and expanding in diameter in the outward or forward direction. As shown in FIGS. 4 and 5, the common axial centerline Y of the cylindrical part 24b and the tapered flange 24c is offset by a distance W from the axial centerline X of the stem 24a. When the side positioning pin 23 is rotated about the centerline X of the stem 24a, the cylindrical part 24b and the tapered flange are also rotated with an eccentricity of the distance W.

The stem 24a is provided at an intermediate part thereof in its longitudinal direction with a reduced diameter part 25. The tapered flange 24c is provided on its outer face with a groove 26 for insertion thereinto of a tool such as a screw driver (not shown) for turning the side positioning pin 23.

The cylindrical part 24b of this side positioning pin 23 of the above described construction is disposed in a circular hole 27 formed in the punching plate 13 and is seated on the front surface of the table 12, as shown in FIGS. 3, 4, and 5. At the same time, the stem 24a is inserted in a bore 28 formed in the table 12. Each side positioning pin 23 is thus mounted on the table 12 and is thus held and prevented from slipping out and from rotating by a screw member 29 screwed into the table 12 from its side and abutting against the above mentioned reduced diameter part 25.

The cylindrical part 24b of each side positioning pin 23 is projecting outward or forward beyond the front face of the punching plate 13 by a distance substantially of the order of the thickness of the plate 11 as shown in FIGS. 3 and 4. Against this projecting part of the cylindrical part 24b, a side edge of the plate 11 is placed in abutting contact, whereby the side positioning of the plate 11 on that side is accomplished. Furthermore, between the cylindrical part 24b and the rim surface of the hole 27 in the punching plate 13, a gap δ of a suitable value in comparison with the thickness of the plate 11 is formed even with the cylindrical part 24b in its state of maximum eccentricity, as indicated in FIG. 4, and slipping of the plate 11 into the gap between the cylindrical part 24b and the rim of the hole 27 is thus prevented. This structural arrangement of the side positioning device according to this invention is a significant improvement over that of a known device as described below.

Figure 6:
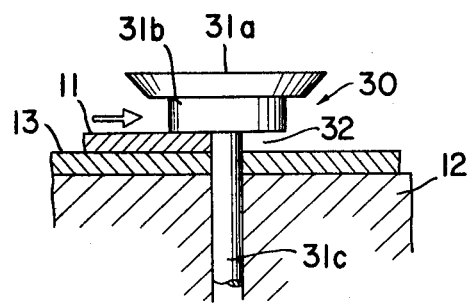
FIG. 6 is a view similar to FIGS. 3 and 4 showing the mounting structure of a known side positioning pin.

The known side positioning device, as illustrated in FIG. 6, is a side positioning pin 30 comprising a stem 31c, a cylindrical part 31b supported on the stem 31c, and a tapered head part 31a formed integrally with the cylindrical part 31b on the outer end thereof. Normally, one side edge part of the plate 11 is inserted between the head part 31a and the punching plate 13, and the extreme side edge of the plate 11 is placed in abutting contact with the cylindrical part 31b.

In this known side positioning device, however, when the side edge of the plate 11 is caused to abut against the cylindrical part 31b, there is the possibility of side edge slipping into a gap 32 between the cylindrical part 31b and the front face of the punching plate 13 as indicated in FIG. 6 because of the short length of the cylindrical part 31b in its axial direction. Furthermore, with this known side positioning device, it is difficult to position the plate 11 in the horizontal direction and to adjust the position thereof.

Returning to the example of the side positioning pin 23 of this invention illustrated in FIGS. 3, 4, and 5, the cylindrical part 24b is caused to undergo eccentric rotation by offsetting the axial centerline Y of the cylindrical part 24b and the tapered flange 24c by the distance W relative to the axial centerline X of the stem 24a, as described hereinbefore. Alternatively, however, instead of the cylindrical part 24b of circular cross section, a cylindrical part of a non-circular cross section, such as an ellipse, may be formed, whereby this non-circular cylindrical part will undergo essentially an eccentric rotation relative to the stem 24a.

Figure 7:
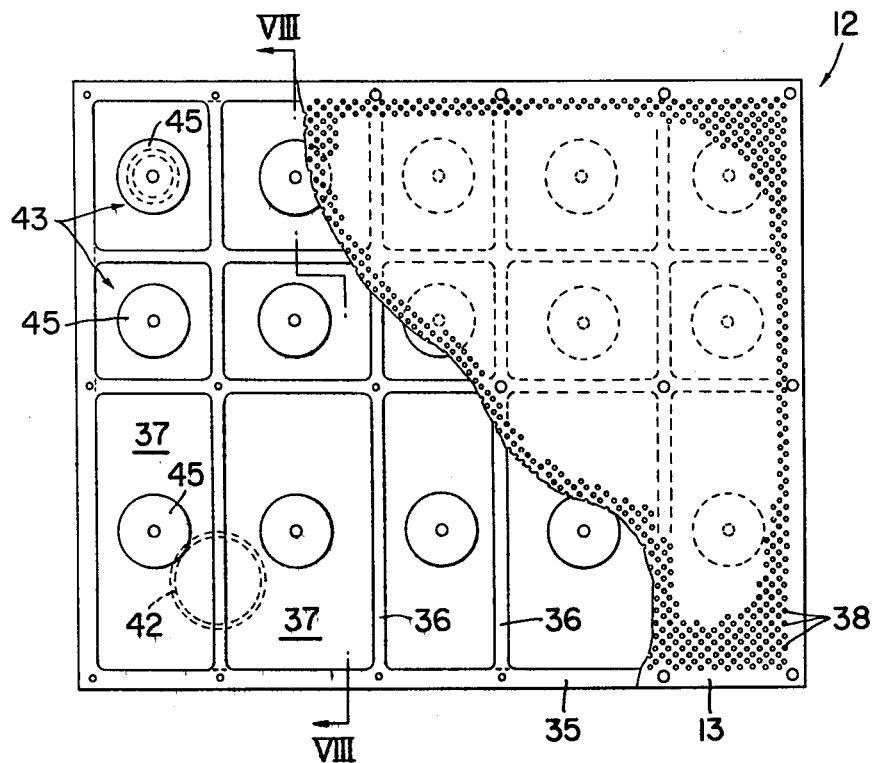
FIG. 7 is a front planar view, with a part cut away, of one example of a plate suction fixing device embodying this invention.
Figure 8:
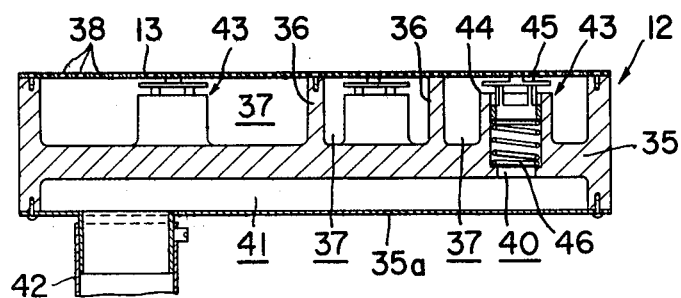
FIG. 8 is a section taken along the plane indicated by line VIII—VIII in FIG. 7 as viewed in the arrow direction.

The aforementioned table 12 constitutes a device for fixing by suction a plate 11 and, as shown in FIGS. 7 and 8, has a box-shaped casing 35. The interior of this casing 35 is divided by grid-like partition walls 36 to form a great number of first-stage compartments 37. The partition walls 36 are formed integrally with the casing 35 by a process such as casting or welding. All of the compartments 37 are open at their front faces lying in the same plane. The aforementioned punching plate 13 is fixed to the casing 35 in a manner to cover these front openings of the compartments 37. A large number of punching holes 38 are formed in a regular pattern in the punching plate 13.

The areas of the front-face openings of the firststage compartments 37 may be uniform or not uniform as shown in FIGS. 7 and 8, but it is desirable that inner volumes of all compartments 37 be of a substantially constant value. The purpose of this is to cause the rates of suction applied to the plate 11 to be substantially uniform at the time when the plate 11 is drawn and fixed by suction against the punching plate 13 of the table 12.

Each compartment 37 is provided through its rear wall with a valve port 40. All compartments 37 communicate via their respective valve ports 40 with a common chamber or manifold 41 of a second stage. This manifold 41 is formed on the rear side of the casing 35 and is of a gas-tight construction, being covered by a cover plate 35a. The manifold 41 is connected through a suction pipe 42 to a negative pressure source (not shown) such as a blower.

A valve device 43 is provided within each compartment 37 in a state of covering the valve portion 40. Each valve device 43 has a valve seat 44, a valve 45 adapted to advance toward or retract from the valve seat 44, and a compression spring 46 for resiliently pressing against and holding the valve away from the valve seat 44, that is, in a position for opening the valve port 40. The compression spring 46 is accommodated within a cylindrical bore constituting the valve port 40, and its end opposite its end pressing against the valve 45 is retained by an annular ledge formed around the wall of the bore. Thus, the valve 45 is supported by the spring 46 in a floating state in a position for opening the valve port 40.

Figure 9:
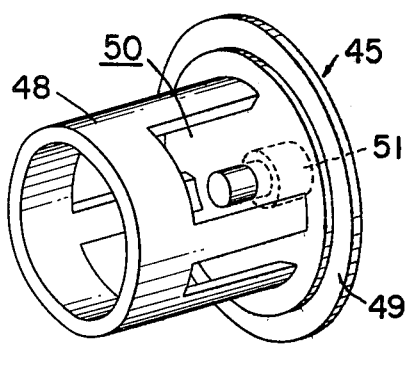
FIG. 9 is a relatively enlarged perspective view showing a valve of a valve device which is used in each of the several compartments of the device illustrated in FIGS. 7 and 8.

Each valve 45, which is formed from a resin material, has a guide cylinder 48, as shown in FIG. 9, slidably fitted within the cylindrical bore of the valve port 40 and a valve flange 49 formed integrally and coaxially with the guide cylinder 48. The valve flange 49 is designed to be pressed against the valve seat 44 thereby to cover and close the valve port 40. The guide cylinder 48 is of hollow cylindrical shape, and its bottom opens into the valve port 40. Communicating openings 50 are formed in the cylindrical wall of the guide cylinder 48 and function to communicate the pertinent compartment 37 with the valve port when the valve 45 assumes its floating state at its open position.

Figure 11:
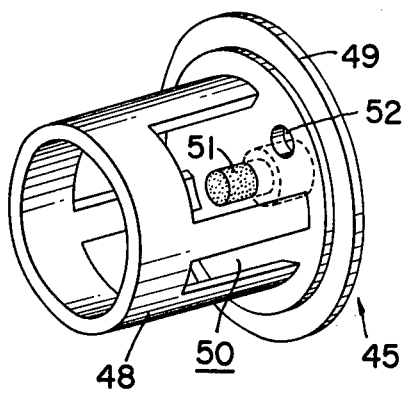
FIGS. 10 and 11 are similar perspective views respectively showing examples of modification of the valve shown in FIG. 9.
Figure 10:
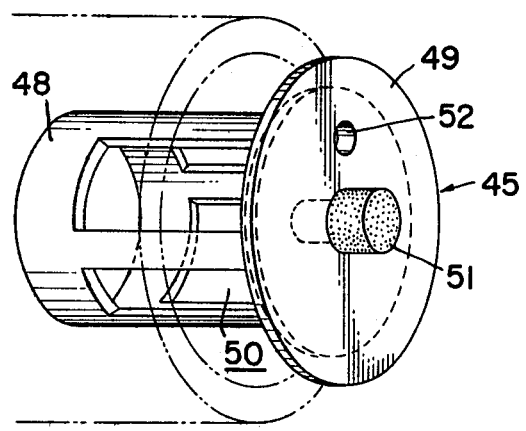

Furthermore, an impact-absorbing member 51 possessing great elasticity, such as a rubber member, is secured to the center of the valve flange 49 and projects outward or forward therefrom, thereby being capable of abutting against the rear face of the punching plate 13. By this abutting action, any impact force due to the motion of the valve 45 is absorbed. In addition, a vent hole for return stroke may be provided in the valve flange 45 as shown in FIGS. 10 and 11. When a vent hole 2 is provided, the return of the valve 45 toward the open position due to force of the compression spring 46 is carried out smoothly.

The action of drawing and fixing by suction a plate 11, such as a printing plate for offset printing, against the punching plate 13 will now be described.

The plate 11 is placed on the punching plate 13 of the table 12 and is positioned by means of the bottom positioning member 20 and the side positioning pins 23. Prior to this positioning procedure, however, the side positioning pins 23 are adjusted.

For this adjustment of the side positioning pins 23, the screw members 29 are first loosened to enable the pins 23 to rotate freely. The pins 23 are then turned about the axial centerlines X of their stems 24a. The cylindrical parts 24b and the tapered flanges thereupon undergo eccentric rotation, and the position in the lateral direction of the plate 11 described hereinafter can be adjusted within a dimensional range of 2W. After the plate 11 has been suitably set in the desired sidewise position by thus turning the side positioning pins 23, the screw members 29 are tightened. The inner tips of the screw members thereupon press against the reduced diameter parts 25 of the stems 24a, thereby preventing the pins 23 from slipping out and from rotating.

After the side positioning pins 23 have been thus adjusted and fixed, the plate 11 is placed on the punching plate 13 of the table 12, and its side edges are fitted against the side positioning pins 23 to carry out side positioning. At the same time, bottom positioning is accomplished by means of the bottom positioning member 20. This bottom positioning is carried out, as indicated in FIG. 2, by causing the bottom edge of the plate 11 to slide downward along the declining surface 21b of the supporting part 21 of the bottom positioning member 20 until it rests on the bottom surface 21a.

Furthermore, in the side positioning procedure, one side part of the plate 11, as indicated in FIGS. 3, 4, and 5, is guided by the tapered flange 24c of the corresponding side positioning pin 23 and contacts the outer peripheral surface of the cylindrical part 24b. At the same time, a force due to the tapered flange 24c acts on the plate 11 to press it toward the punching plate 13. For this reason, the plate 11 can be effectively pressed into intimate contact with the punching plate 13 even if the plate is thermally deformed. In addition, between the cylindrical part 24b and the inner rim surface of the hole 27 in the punching plate 13, a clearance at the most of a suitable dimension δ relative to the thickness of the plate 11 is maintained. Therefore, slipping of the plate 11 into this space between the cylindrical part 24b and the hole 27 is effectively prevented.

After the bottom positioning and the side positioning of the plate 11 have been completed, the blower (not shown) within the cabinet housing is started. The negative pressure suction thus created is transmitted through the suction pipe 42 and the second-stage common manifold 41 to the valve port 40, and suction is applied to the air in the first-stage compartments 37. Negative pressure is thus created in all compartments 37, whereby the valves 45 are moved onto their valve seats 44.

If, when the valves 45 are moved to the valve seats 44, a portion of the punching plate 13 of the table 12 is covered by the plate 11, the air flow into the compartments 37 through the punching holes 38 of that portion is stopped, whereby the compartments 37 under that portion rapidly assume a negative pressure state, which becomes balanced with that in the valve port 40. As a result of this pressure balance, the valves 45 are moved to their opened positions by the force of their compression springs 46 and are held in their opened state.

On the other hand, at the parts of the punching plate 13 of the table 12 not covered by the plate 11, air flows into the compartments 37 through the punching holes 38 of the punching plate 13. As a consequence, the reduction of the pressure within these compartments 37 to a negative pressure is retarded. At the same time, the suction of the air drawn through the compartments 37 into the valve port 40 causes the valves 45 to move toward the valve seats 44, overcoming the force of their compression springs 46, and their valve flanges 49 tightly contact their valve seats 44.

In this manner, the plate 11 is drawn by suction against the punching plate 13 of the table 12 and is thus fixed. Thereafter, below the parts of the punching plate 13 not covered by the plate 11, the inflow of air through the punching holes 38 is stopped by the closing action of the valve devices 43. Beneath the parts covered by the plate 11, the inflow of air through the punching holes 38 is stopped by the plate 11 in intimate contact with the punching plate 13. Therefore, at the time of measurement of pattern area after fixing of the plate 11, there is no inflow of air whatsoever through the punching holes 38, whereby generation of noise accompanying air inflow is prevented.

After the plate 11 has thus been placed in intimate contact with and fixed to the punching plate 13, the inspection head 18 is caused to travel in a lateral direction along the guide rails 16 and 17, during which it detects the area and darkness/lightness of the image line parts (i.e., pattern parts) of the plate 11.

If the aforementioned blower is operated with no plate 11 in place against the punching plate 13, the negative pressure suction will be transmitted through the suction pipe 42 and the second-stage common manifold 41 to the valve ports 40 and draw the valve flanges 49 of the valves 45, overcoming the force of their compression springs 46, and the valve flanges 49 are thereby sucked into intimate contact with the valve seats 44. The valves 45 are thus shut, and the valve devices 43 are closed.

Figure 12:
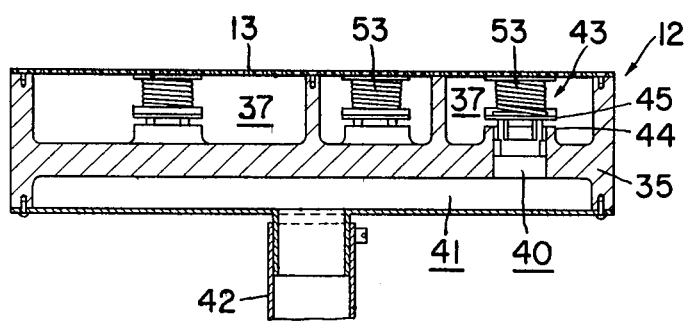
FIG. 12 is a sectional view, similar to FIG. 8, showing a first example of modification of the device according to this invention.

A first example of modification of the plate suction and fixing device of this invention will now be described with reference to FIG. 12. This modified device differs from the preceding example in that a tension spring 53 is used in place of a compression spring in each valve device 43. In all other respects, the parts and their organization of this modification are substantially the same as those of the preceding example. Accordingly, such parts are designated by like reference numerals, and detailed description thereof will not be repeated. (This applies also to the second and subsequent examples of modification.)

The tension spring 53 of each valve device 43 is interposed between the punching plate 13 of the table 12 and the valve 45 and normally holds the valve 45 in a floating state above the valve seat 44, maintaining the valve port 40 in opened position.

Then, when the blower used as a source of negative pressure is started, the resulting negative pressure suction acts to overcome the tension force of each tension spring 53 and, similarly as in the preceding example, presses and moves the valve body 45 against the valve seat 44.

Figure 13:
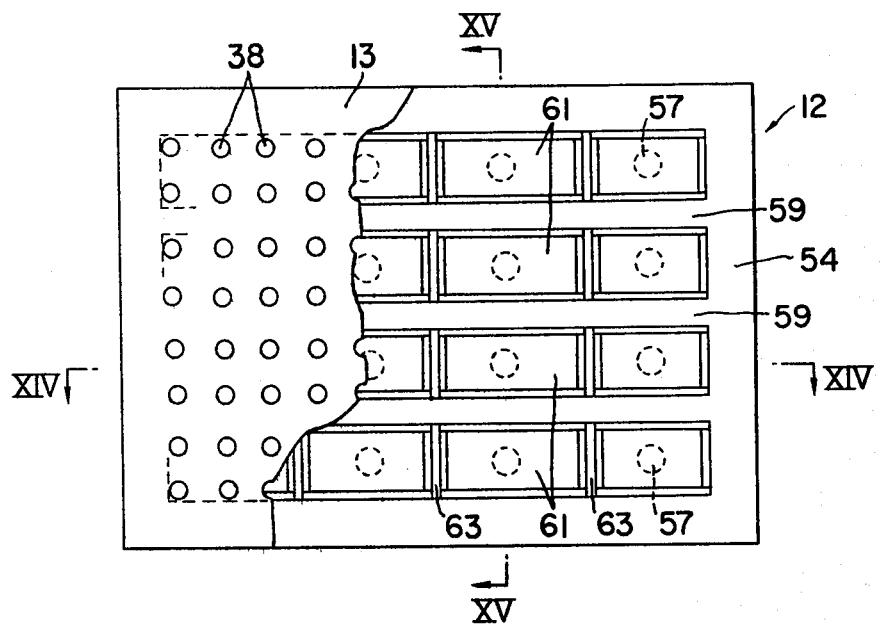
FIG. 13 is a front planar view, with a part cut away, showing a second example of modification of the device of the invention.
Figure 14:
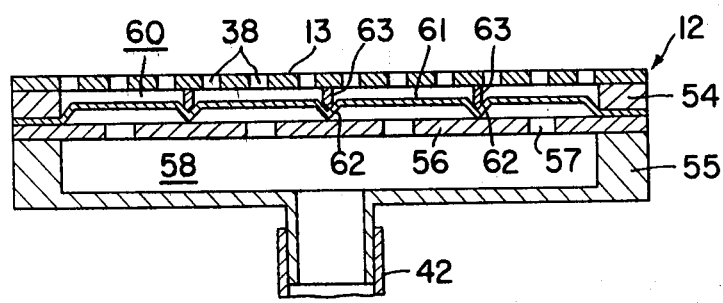
FIG. 14 is a section taken along the plane indicated by line XIV—XIV in FIG. 13 as viewed in the arrow direction.
Figure 15:
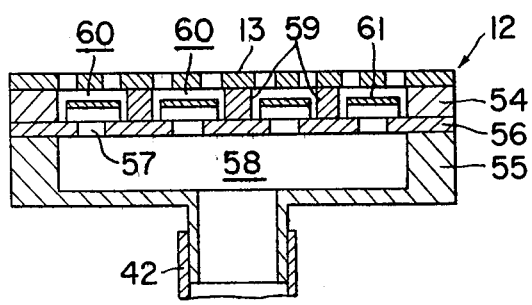
FIG. 15 is a section taken along the plane indicated by line XV—XV in FIG. 13 as viewed in the arrow direction.

In a second example of modification of the plate suction and fixing device of this invention, as illustrated in FIGS. 13, 14, and 15, the casing of the table 12 is of a divided construction comprising a first casing element 54 on the front side and a second casing element 55 on the rear side, the two casing elements 54 and 55 being divided by a partition plate 56 interposed therebetween. At various specific positions of the partition plate 56, valve ports 57 are formed. This partition plate 56 forms a common manifold 58 within the second casing element 55. This common manifold 58 is connected by way of a suction pipe 42 provided on the back side to a source of negative pressure such as a blower.

On the other hand, the interior of the first casing element 54 is divided by parallel horizontal partition plates 59 into long and narrow rectangular chambers 60. These rectangular chambers 60 are disposed parallelly and are covered at their front open parts by a punching plate 13. The partition plates 59 are integrally formed with the first casing element 54 by a process such as casting. The rectangular chambers 60 extend horizontally and respectively accommodate therewithin valves 61 of long band shape. These valves 61 are clamped gas-tightly at their ends by the two casing elements 54 and 55. Each valve 61 is made of an elastic material such as a leaf spring plate and has a width less than that of the rectangular chamber 60 in which it is accommodated.

Furthermore, each valve 61 has V-shaped or U-shaped rearwardly-projecting creases 62 extending in its transverse or width direction at specific space intervals in its longitudinal direction. A partition plate 63, functioning doubly as a valve retainer, is interposed between the front trough part of each crease 62 and the punching plate 13, the partition plates 63 of each rectangular chamber 60 further dividing the chamber 60 into a plurality of small compartments. Each of these small compartments is provided with one of the aforementioned valve ports 57 formed through the rear wall, that is, the partition plate 56, and communicates through its valve port 57 to the common manifold 58.

Because of the creases 62, which on their rear or crest side abut against the partition plate 56, the above described valves 61 are, in their free state, held in a state of flotation away from the valve ports 57. Then, when a negative pressure source such as a blower is operated, the resulting negative pressure suction draws the valves 61 toward the valve ports 57, which are thereby closed. When the negative pressure source is stopped or shut off, the valves 61 separate away from the valve ports 57 as a consequence of their elastic restoration force, and the valve ports 57 are opened.

Figure 16:
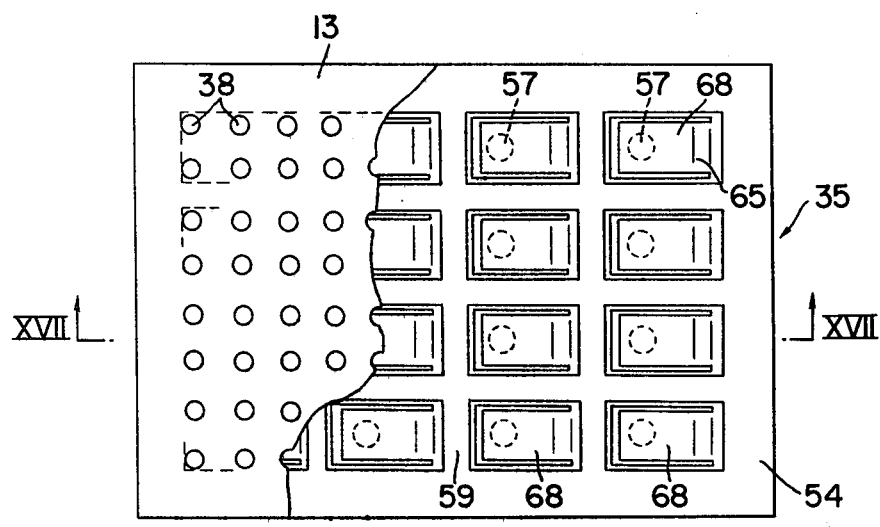
FIG. 16 is a front planar view, with a part cut away, showing a third example of modification of the device of the invention.
Figure 17:
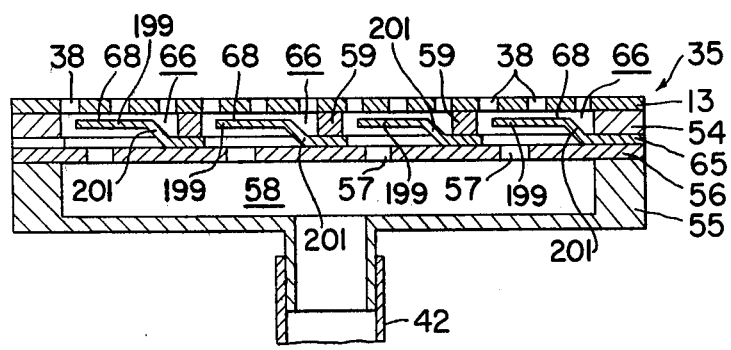
FIG. 17 is a section taken along the plane indicated by line XVII—XVII in FIG. 16 as viewed in the arrow direction.

In a third example of modification of the plate suction fixing device of this invention as illustrated in FIGS. 16 and 17, a partition plate 56 is disposed between a valve plate 65 and the casing 55 surrounding the manifold 58. The valve plate 65 has integral with it, valves 68 in the shape of joggled plates (i.e., substantially rectangular displaced portions). These valves 68 comprise at least two members 201 and 199. Member 201 extends upwardly from the base of valve plate 65 toward punching plate 13. Member 199 is integral with member 201. Member 199 is a tongue having a rectangular shape. Member 199 is disposed substantially over valve port 57. At the same time, grid-like partitions 59 are provided in and integrally with the first casing element 54 and thereby form a large number of compartments 66 within the first casing element 54. The front open parts of all compartments 66 are covered by a punching plate 13, and a valve port 57 is formed in the partition plate 56 at the back of each compartment 66. The compartments 66 are communicative via their respective valve ports 57 with a common manifold 58 formed within the second casing element 55.

Each valve 68 has a tongue-like valve plate part 199 disposed within the respective compartment 66. In its free state, each valve plate part is held by its elastic force in a floating state wherein it is separated from its valve port 57. When a negative pressure source such as a blower operates, and the resulting suction acts on a valve plate part 199, this valve plate part is drawn toward, covers, and closes its valve port 57.

Figure 18:
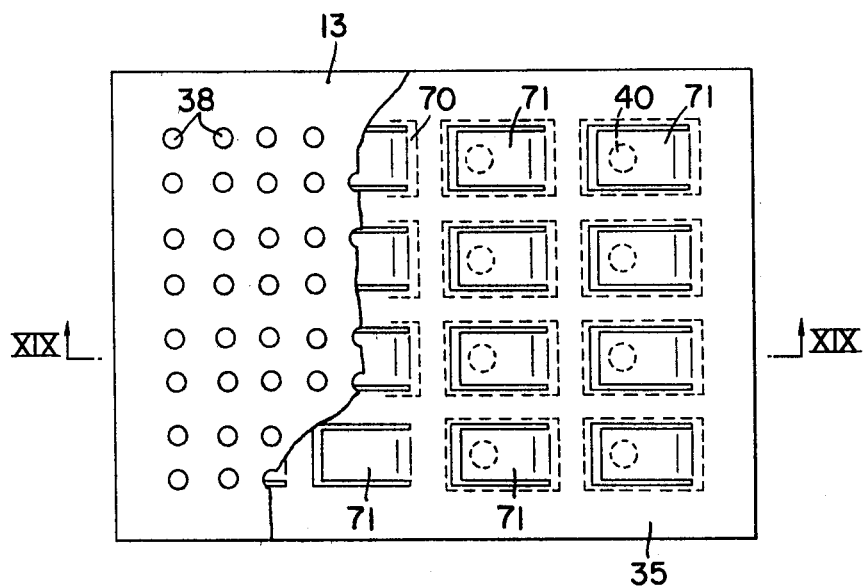
FIG. 18 is a front planar view, with a part cut away, of a fourth example of modification of the device of the invention.
Figure 19:
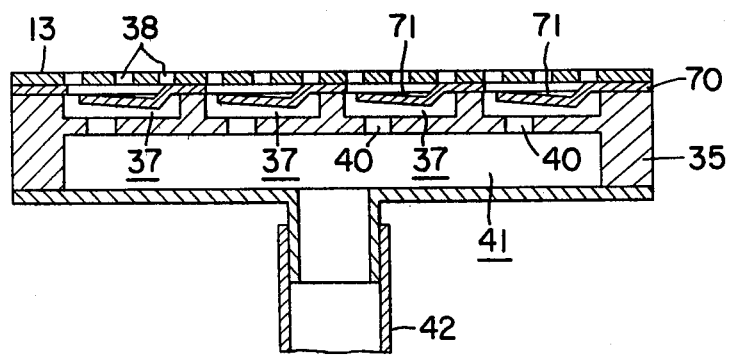
FIG. 19 is a section taken along the plane indicated by line XIX—XIX in FIG. 18 as viewed in the arrow direction.

In a fourth example of modification of the device of this invention as shown in FIGS. 18 and 19, use is made of a casing 35 which is essentially the same as that in the first described example. Valves 70 of the shape of joggled plates are interposed at root parts thereof between the front face of this casing 35 and a punching plate 13. Each valve 70 has a tongue-like valve plate part 71 which is disposed within a respective compartment 37 and is adapted to tightly close a respective valve port 40. In its free state, each valve plate part 71 is caused by its elastic force to be held in a state of separation from its valve port 40.

Figure 20:
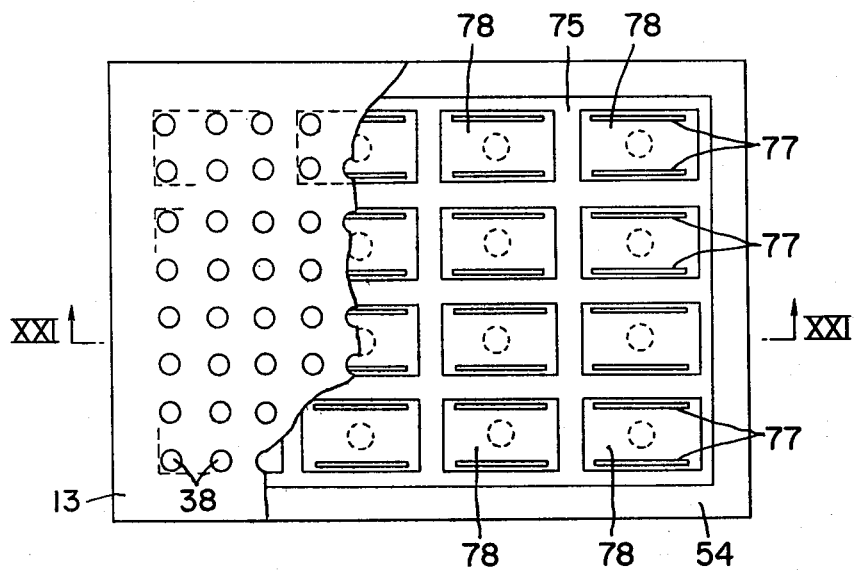
FIG. 20 is a front planar view, with a part cut away, of a fifth example of modification of the device of the invention.
Figure 21:
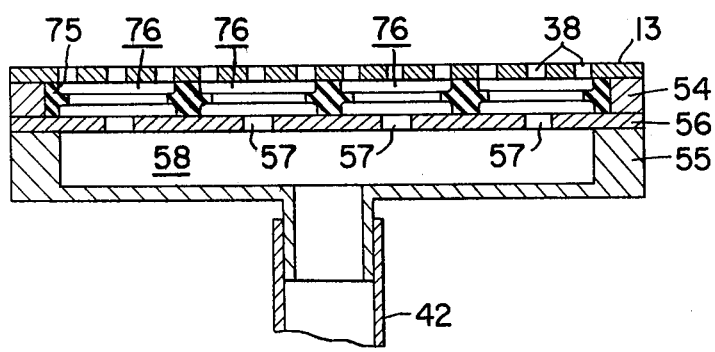
FIG. 21 is a section taken along the plane indicated by line XXI—XXI in FIG. 20 as viewed in the arrow direction.

In a fifth example of modification of the device of this invention as shown in FIGS. 20 and 21, a partition plate 56 is interposed between first and second casing elements 54 and 55 of the casing, and, at the same time, a multiple-valve assembly 75 functioning doubly as a partitioning structure is accommodated within the first casing element 54, this multiple-valve assembly 75 dividing the interior of the first casing element 54 into a large number of compartments 76. The front open parts of all compartments 76 are covered by a punching plate 13.

In each compartment 76, on opposite sides thereof, the multiple-valve assembly 75 has a pair of parallel slits 77 extending in the horizontal direction, for example. Between and by each pair of these parallel slits 77, a valve plate part 78 is formed in an elastically deflectable manner in the multiple-valve assembly 75 and is capable of closing a respective valve port 57. In its free state wherein it is not being subjected to negative pressure, each valve plate part 78 is so held as to be separated from its valve port 57.

Figure 22:
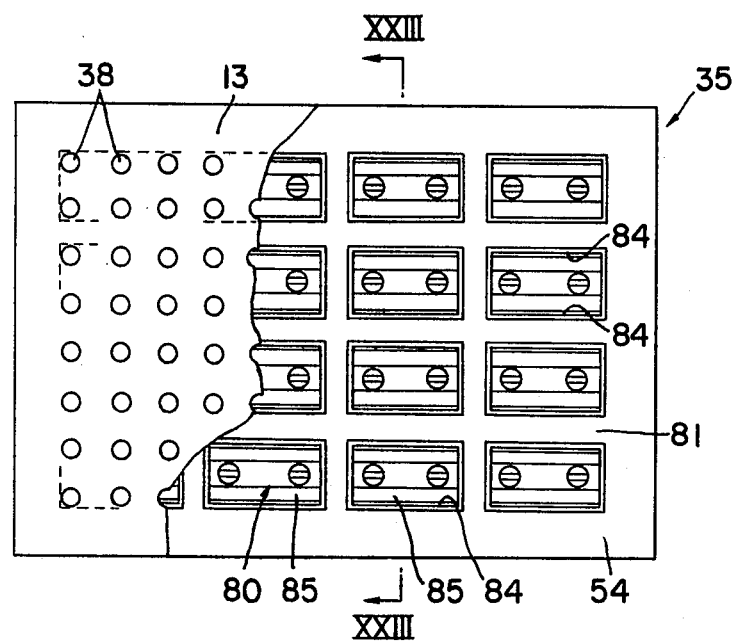
FIG. 22 is a front planar view, with a part cut away, of a sixth example of modification of the device of the invention.
Figure 23:
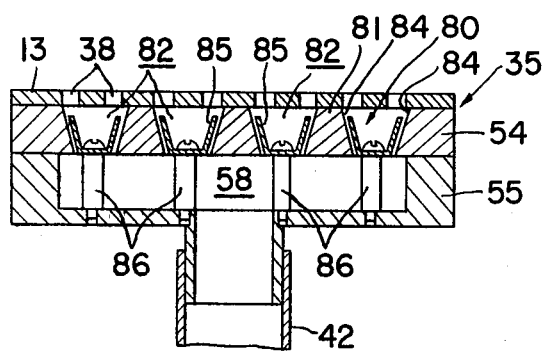
FIG. 23 is a section taken along the plane indicated by line XXIII—XXIII in FIG. 22 as viewed in the arrow direction. Throughout this disclosure, terms indicating directions, such as "front", "rear", "left", and "right", are those as viewed from the position of an operator in front of an apparatus for measuring pattern area such as that shown in FIG. 1. Accordingly, the "front" of the apparatus is that part thereof nearest the operator.

A sixth example of modification of the device of this invention as illustrated in FIGS. 22 and 23 is characterized by the construction of its first casing element 54 of its casing 35 and of its valve devices 80. More specifically, grid-like partition walls 81 are formed in and integrally with the first casing element 54 and thereby form therein a large number of compartments 82. At the same time, the opposed wall surfaces of the partition walls 81 of each compartment 82 form valve seats 84 of the corresponding valve device 80. A valve 85 of V-shaped or trough-shaped section as viewed in FIG. 23 is disposed in intimately adherable state relative to a respective pair of the valve seats 84. Each valve 85 is fixed to the front end of a holding pin 86 fixed to the rear wall of a common manifold 58 formed in the second casing element 55.

Then, when suction produced by a negative pressure source such as a blower is applied, each valve 85 subjected to this suction is drawn against its valve seat 84, thereby closing a respective valve port communicating with the common manifold 58. In this case, the valve port is formed at the interface between each compartment 82 and the common manifold 58. In its free state in which it is not being subjected to suction, each valve 85 is held by its elastic force in a state of separation from its valve seats 84, in which the valve port is opened.

In each of the above described embodiments of this invention, the small compartments are connected to a negative pressure source by way of a second-stage common manifold, but these small compartments may be connected directly to the negative pressure source through their valve ports, or they may be connected to the negative pressure source via a plurality of stages of common manifolds.

Furthermore, the shapes of the small compartments formed within the casing need not be limited to those in the above described examples but may be different. In all cases, however, it is desirable that the interior volumes of all small compartments in any one casing be substantially equal.

As described above, in the plate suction fixing device according to this invention, the interior of a casing is divided to form a plurality of compartments having open front faces, which are covered by a punching plate, and having on their rear sides respective valve ports provided with respective valve devices. Since, at the same time, these compartments are connected to a negative pressure source, the interior volume of each of these compartments formed within the casing can be made small, and the pressure therein responds promptly to the operation of the negative pressure source. For this reason, the entire surface of the plate, such as a printing plate, can be caused to adhere intimately onto the surface of the punching plate in a rapid and positive manner.

Furthermore, since the valve of each valve device is held by an elastic member in a position for opening its valve port, when negative pressure suction is applied by the negative pressure source to the valve port, the valve is automatically and efficiently actuated in opening or closing action depending on the covering state of the plate being fixed. More specifically, in the case where the plate is covering the punching holes, the valve device is not closed even when suction is applied to the valve port, and the plate is fixed by suction directly and positively. On the other hand, in the case where the plate is not placed in position, or only some of the punching holes are covered, the valve device is automatically closed, whereby there is no continuous drawing in of air through the punching holes, and loss of energy is prevented. Moreover, generation of noise of air passing through the valve port is prevented.

Still another feature of this invention is that, because of the provision of the plate bottom positioning device and the plate side positioning device as described above, the plate can be positioned accurately and positively on the punching plate by merely placing the bottom and sides of the plate against these positioning devices. Particularly in the case of a plate which is a printing plate for offset printing, calibration marks for position matching are inscribed on the lower part of the printing plate, and it is important to elevate the precision in fixing the printing plate in intimate contact with the punching plate. By providing bottom and side positioning devices according to this invention, the printing plate can be accurately and positively fixed in place, whereby the precision in measuring the area and darkness/lightness of the pattern can be improved.

A further feature of this invention is that, since the cylindrical part of each of the side positioning pins of the side positioning device is offset or eccentric relative to the stem of that pin, fine adjustment of the position in the lateral or horizontal direction of a printing plate for offset printing is possible. Furthermore, the operation is facilitated.

An additional feature of this invention is that, because a gap of a suitable dimension relative to the thickness of the printing plate is maintained between the cylindrical part of each side positioning pin and the rim inner surface of the corresponding hole in the punching plate, slipping of the printing plate into this gap is effectively prevented. As a result, the positioning of the plate becomes accurate and positive. At the same time, deformation of the plate due to any such slipping of the plate into the gap can be prevented, whereby the succeeding process step is simplified.

What is claimed is:

1. A device for measuring the area of a printing image or pattern on a printing plate for an offset printing press, said device comprising:

an inspection head having an optical measuring instrument such as a sensor for detecting the darkness/lightness of the printing image or pattern;

a guide means for guiding the inspection head over the printing plate fixed to a table;

a first casing means, the interior of which is partitioned in a grid-like manner and formed into a plurality of small compartments having open front faces lying in a single plane, said grid-like partition walls being formed integrally with the first casing means by a casting process;

a second casing means surrounding a manifold;

a partition plate interposed between said first and second casing means and between said first casing means and said manifold, said partition plate thereby separating said first casing means from both said second casing means and said manifold;

said partition plate comprising a plurality of valve ports communicating said manifold with said plurality of small compartments within said first casing means;

an elastic valve plate disposed on said partition plate;

said elastic valve plate comprising a plurality of elastic valves each formed from the material of said valve plate and integral at one edge with said valve plate by making at least one cut in said valve plate to form said valve and bending said valve at said point where said valve is integral with said plate;

said elastic valves, each disposed within one of said small compartments in said first casing means;

said elastic valves, each having a member substantially disposed over a valve port in the partition plate for closing a valve port in the partition plate;

a punching plate having a great number of punching holes and fixed to the first casing means so as to cover the open front faces of the compartments, said punching plate forming a part of the table;

a negative pressure source connected by way of the valve ports to the respective compartments and operating to apply suction to all valve plate parts, whereby the printing plate can be fixed on the front side of the punching plate, the valve ports of the compartments covered by the printing plate being designed to be held in an opened state, and the valve plate parts of the compartments not thus covered being designed to be automatically closed by the suction;

a bottom positioning device, for positioning the lower edge of the printing plate, provided at the lower part of the punching plate;

a side positioning device, for positioning the sides of the printing plate, provided in at least one lateral edge part of the punching plate.

2. A device as claimed in claim 1, wherein each elastic valve is normally apart from the corresponding valve port in, said partition plate.

3. A device as claimed in claim 1, wherein each elastic valve comprises at least two integral parts, a first part extending towards said punching plate from said valve plate, and a second part, extending from said first part, forming a tongue disposed substantially over a valve port.

4. A device as claimed in claim 1, wherein said second member of said elastic valve is substantially rectangular in shape.

5. A device as claimed in claim 1, wherein said valve plate has an open space below each valve.

* * * * *